United States Patent [19]

Mikami

[11] Patent Number: 4,463,373
[45] Date of Patent: Jul. 31, 1984

[54] PREVIEWING APPARATUS OF FLATS

[75] Inventor: Atsutoshi Mikami, Sakado, Japan

[73] Assignee: Toppan Printing Co., Ltd., Japan

[21] Appl. No.: 333,993

[22] Filed: Dec. 23, 1981

[30] Foreign Application Priority Data

Dec. 25, 1980 [JP] Japan .................... 55-184480

[51] Int. Cl.³ .................................. H04N 1/46
[52] U.S. Cl. ........................ 358/76; 358/75;
358/80; 358/106
[58] Field of Search ................ 358/75–80,
358/101, 106, 107

[56] References Cited

U.S. PATENT DOCUMENTS 3,972,066  7/1976  Seki ........................... 358/76
4,340,905  7/1982  Balding ....................... 358/80
4,349,835  9/1982  Horiguchi .................... 358/76

FOREIGN PATENT DOCUMENTS 55939  7/1982  European Pat. Off. ............. 358/76

Primary Examiner—Michael A. Masinick
Attorney, Agent, or Firm—Ostrolenk, Faber, Gerb & Soffen

[57] ABSTRACT

The invention provides a previewing apparatus for previewing flats in which characters or color separation films obtained by color separation of an original are attached in a predetermined layout. Utilizing a color CRT monitor, the previewing apparatus can serve for fast checking of registration of the flats, the separation quality, copy, dummy, screen tint and other instructions for completeness and accuracy. Furthermore, the tone of the printed matter can be easily estimated from the flats.

12 Claims, 28 Drawing Figures

FIG.5
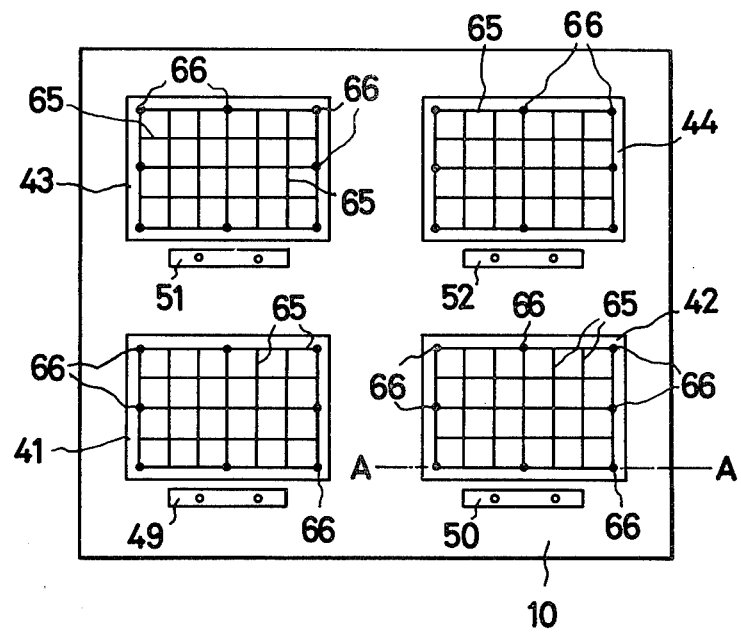
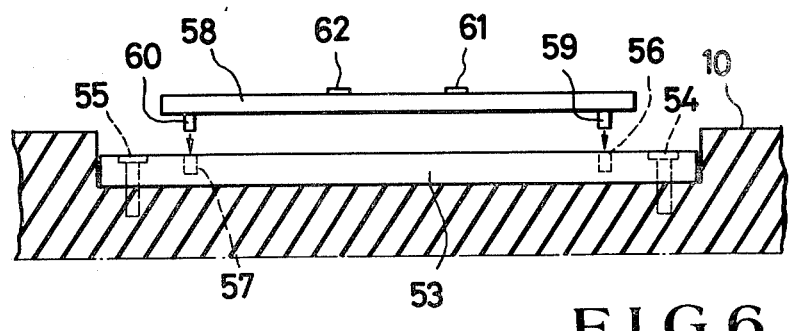
FIG.6
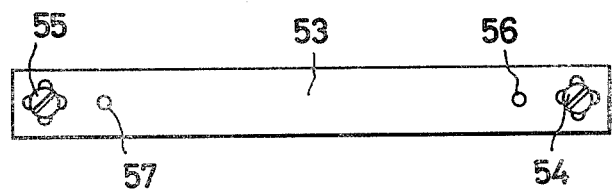
FIG.7

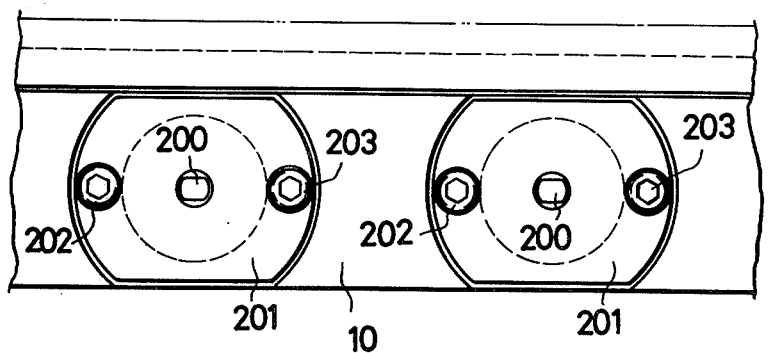
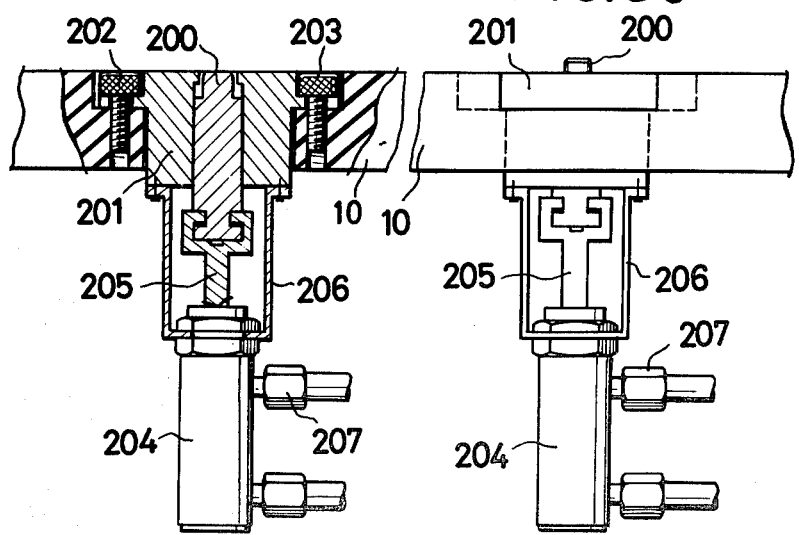

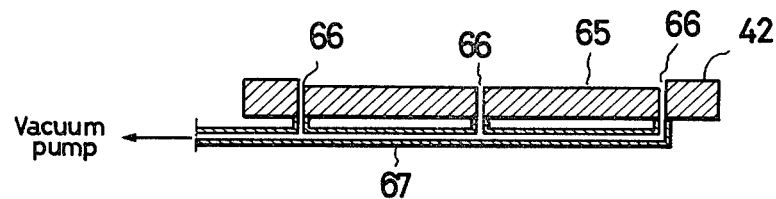
FIG.9
FIG.10
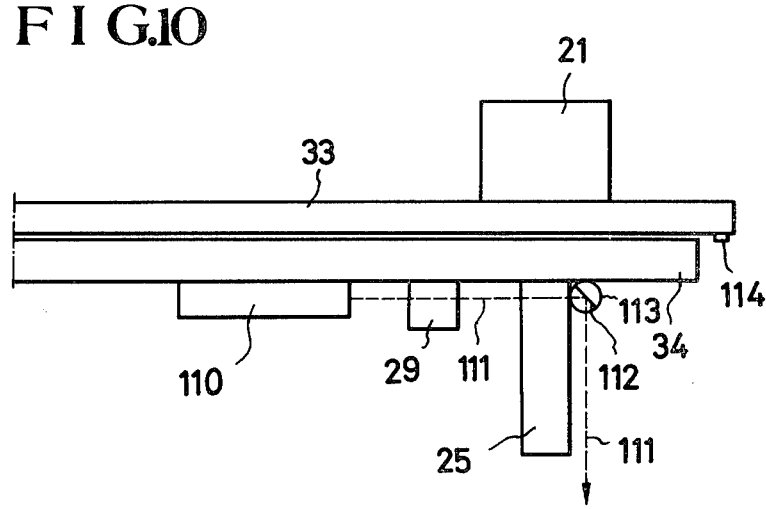
FIG.11
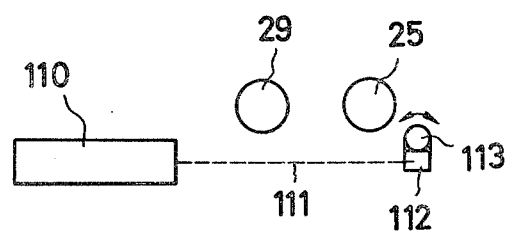

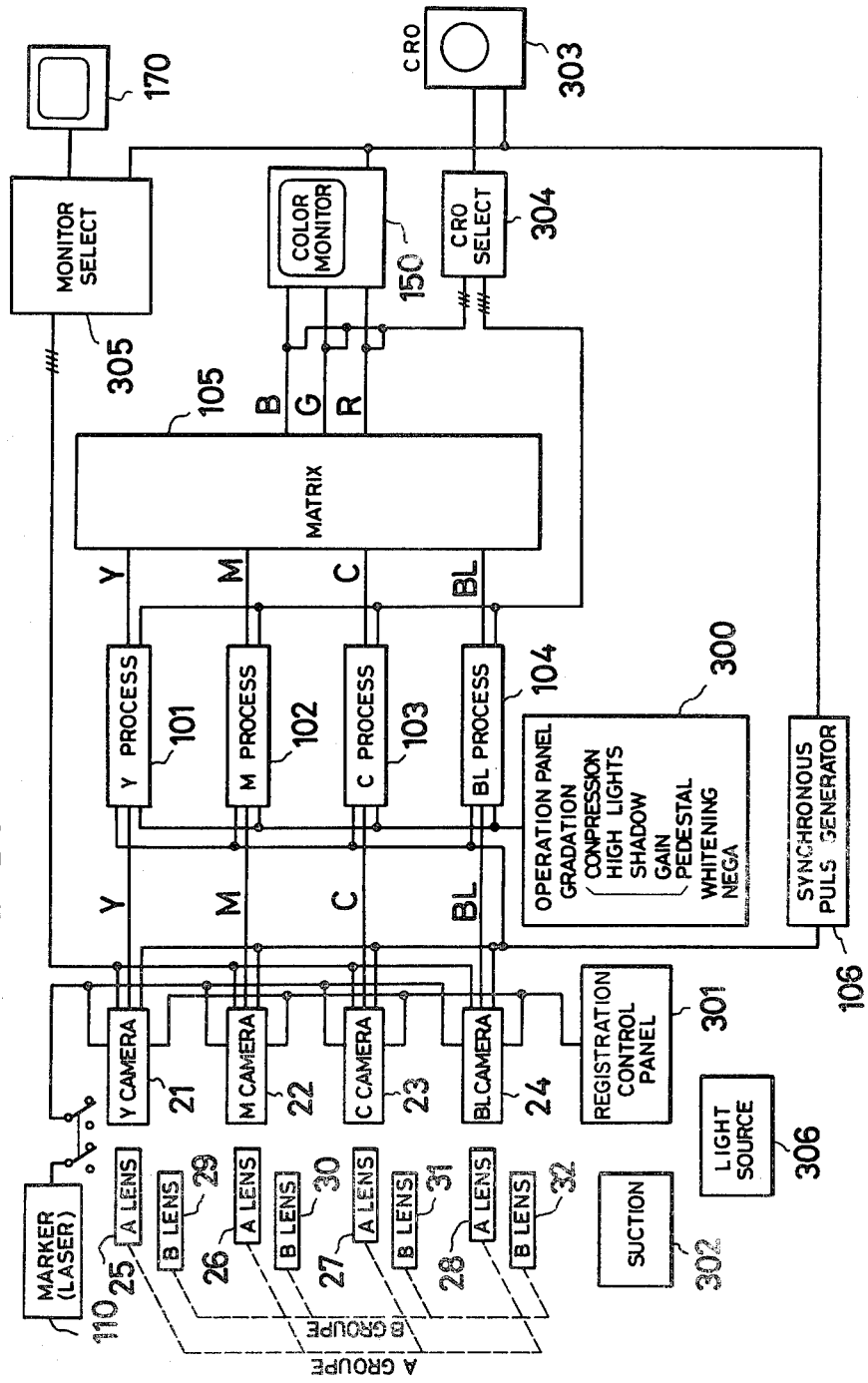

PREVIEWING APPARATUS OF FLATS

BACKGROUND OF THE INVENTION

I. Field of the Invention

The present invention relates to previewing apparatus for previewing color separation flats of respective colors to determine if negatives located on each flat (and representing pictorial or graphic information) are in registration with one another. The negatives are nominally located at predetermined locations on the flats (each flat representing, for example, a therewith for vacuum-contacting said flats are formed in said flat setting table. More specifically, the present invention relates to a previewing apparatus for performing such previewing using a color CRT (cathode-ray tube) monitor.

II. Description of the Prior Art

In order to prepare a printing plate, it is conventionally known, as shown in FIG. 1, to attach a color separation film 1 (obtained by color separation of an original) or characters 2 for each color on a single transparent film 3 to form a color separation flat.* In this case, it is necessary to check if the images of the respective color separation films on each flat have an accurate registration with the color separation films on the remaining flats. As a method for performing this, a method is known according to which, if the four colors of yellow, magenta, cyan and black are involved, the flat corresponding to one of these four colors is selected as a key or standard flat. Another flat is superposed on this standard flat to check registration. Other printing plate films are also superposed on the standard for checking the registration in a similar manner.

*This flat, as an example in the case of offset printing process, is contacted to a PS plate (presensitized plate) which is exposed to light through the flat. The exposed PS plate is developed to be used as a printing plate for the offset printing process.

In this case, however, since both the standard flat and other flats are positives or negatives, it is difficult to check the registration.

As a method to eliminate this drawback, there is known another method, if the four colors of yellow, magenta, cyan and black are involved, according to which a film of an inverted image is prepared from one flat to provide a master flat as a standard, and other flats are superposed on this master flat to check for the registration in the manner described with the method described above. In this case, since the master flat as the standard and the other flats are in opposite relationships: if one is the positive, the other is the negative and vice versa, it is easy to check the registration. However, since extra film is required for preparing the master flat, additional cost and time are involved.

An apparatus is disclosed in U.S. Pat. No. 3,972,066, according to which color separation films separated into the four colors of Y (yellow), M (magenta), C (cyan), and BL (black) are photographed by a television camera and displayed on a color CRT monitor in a composition of colors.

The apparatus disclosed in this patent is designed to estimate the tone of the actual printed matter from the color separation films. With this apparatus, it is difficult to check the registration of flats which are obtained by attaching the color separation films on big transparent film bases in a simple manner and a short period of time and with high accuracy. In other words, the apparatus described in this U.S. patent is essentially contemplated to check the color separation conditions of the color separation films themselves. According to this apparatus, the color separation films corresponding to four colors are each separately photographed by a single fixed camera to store the image information in a memory device, and the stored image information is displayed on the color CRT monitor. Therefore, the area of the image to be displayed is limited to a certain area (i.e., only a portion of the area can be viewed at any given time). This apparatus is not suitable for checking the registration of a flat which requires checking over a wide area with high precision.

The checking of the flat includes, in addition to the checking of the registration, the checking of the separation quality, copy, dummy, screen tint and other instructions for completeness and accuracy. However, no conventional apparatus has been seen which can accomplish checking of various items as described above which good efficiency and in a simple manner.

SUMMARY OF THE INVENTION

It is, therefore, an object of the present invention to provide a previewing apparatus for flats which is easily capable of checking the registration of flats among the respective flats for each color.

It is another object of the present invention to provide a previewing apparatus for flats, which is capable of performing checking with efficiency and ease the color separation conditions, the presence or absence of dropping of the characters or figures, the presence or absence of contamination, the correction of the characters or the like, and so on.

It is still another object of the present invention to provide a previewing apparatus for flats, which has a function of controlling with ease the initial position of television cameras relative to the flats.

It is still another object of the present invention to provide a previewing apparatus for flats, which allows elimination of one or more colors of the respective colors of the flats, and which allows easy display of the monochrome, dichrome, trichrome, and quadrichrome on a color CRT monitor.

It is still another object of the present invention to provide a previewing apparatus for flats, which has a function of converting a color which is hard to recognize with naked eyes to a color which is easy to recognize with the naked eyes.

It is still another object of the present invention to provide a previewing apparatus for flats, which has a function of easily identifying the part of the flats which is being photographed.

It is still another object of the present invention to provide a previewing apparatus for flats, which has a function of allowing setting of the flat to be checked within a short period of time.

It is still another object of the present invention to provide a previewing apparatus for flats, which has a function of allowing easy exchange of pin bars for setting the flat.

It is still another object of the present invention to provide a previewing apparatus which allows easy exchange of lenses of different magnification.

BRIEF DESCRIPTION OF THE DRAWINGS

FIG. 5 shows an example of a flat setting table of the apparatus according to the present invention;

FIG. 6 is a sectional view of an example of a mounting mechanism of pin bars of the apparatus according to the present invention;

FIG. 7 is a plan view showing an example of a pin bar setting plate of the apparatus according to the present invention;

FIGS. 8(a) to 8(c) show examples of pin setting mechanisms of the apparatus according to the present invention;

FIG. 9 is a sectional view of an evacuating mechanism of a flat holder of the apparatus according to the present invention, along the line A—A of FIG. 5;

FIGS. 10 and 11 are a sectional view and a plan view, respectively, of a photographing section indicator of the apparatus according to the present invention;

FIG. 19 is a schematic block diagram of the apparatus according to the present invention.

DETAILED DESCRIPTION OF THE PREFERRED EMBODIMENTS

The present invention thus provides a novel previewing apparatus which eliminates the drawbacks of the conventional previewing apparatus and which is capable of checking various items of the flats in a simple manner and within a short period of time.

The apparatus of the present invention utilizes television cameras to check the registration of the flats by observation of the superposed image on the color CRT monitor.

With the apparatus of the present invention, it is possible to perform the checking of the separation quality, copy, dummy, screen tint and other instructions for completeness and accuracy, and so on in a simple manner and a short period of time.

Figure 2:
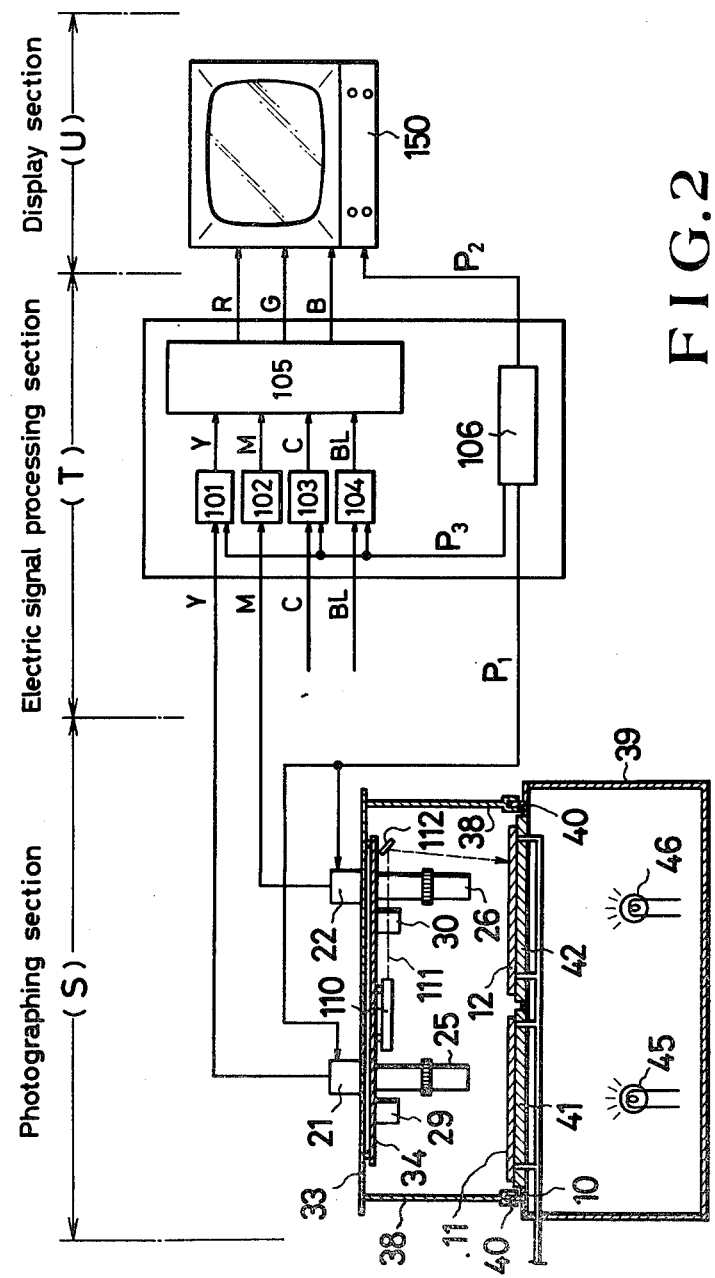
FIG. 2 is a schematic view of a previewing apparatus according to the present invention.

The previewing apparatus of the present invention basically comprises, as shown in FIG. 2, a photographing section (S) for simultaneously photographing a plurality of flats with television cameras, an electric signal processing section (T) which processes the image signals of the flats obtained by photographing with the television cameras and into electric signals in order to display on a color CRT monitor in a composition of colors, and a display section (U) which displays an image of the flats on the basis of the electric signals processed in said electric signal processing section (T).

Figure 3:
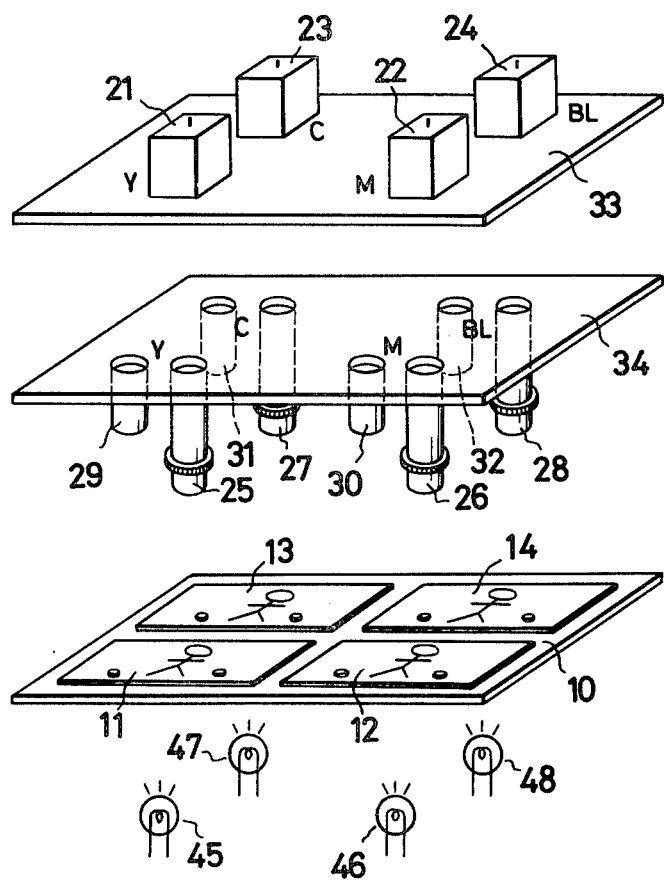
FIG. 3 is a view showing a photographing section of the apparatus of the present invention.

Since color printing is generally performed in four colors, the following description will be made in the case of processing typical flats of four colors. However, it is to be understood that the present invention is similarly applicable to the case of two or three color printing. The photographing section (S) has, as may be seen well from FIGS. 2 to 4, a flat setting table 10 for holding four flats 11, 12, 13 and 14 corresponding to Y (yellow), M (magenta), C (cyan) and BL (black), respectively, each flat being located on a respective flat support area of the table 10; and television cameras 21, 22, 23 and 24 for photographing the four flats 11, 12, 13 and 14 held on the flat setting table 10. On these television cameras 21, 22, 23 and 24 are mounted lenses 25, 26, 27 and 28 of high magnification, and lenses 29, 30, 31 and 32 of low magnification so that they can be switched. The television cameras 21 to 24 are held on a camera base 33 to establish constant relative positions with each other. The lenses 25 to 32 are held by a lens base 34. In FIG. 3, the distance between the camera base 33 and the lens base 34 is emphasized for the sake of easy understanding.

In FIG. 3, the camera base 33 and the lens base 34 are respectively shown in a single plate form. However, the camera base 33 and the lens base 34 are not limited to those of plate shape, and may take any other forms as long as the relative positions of the television cameras and lenses are kept constant.

Figure 4:
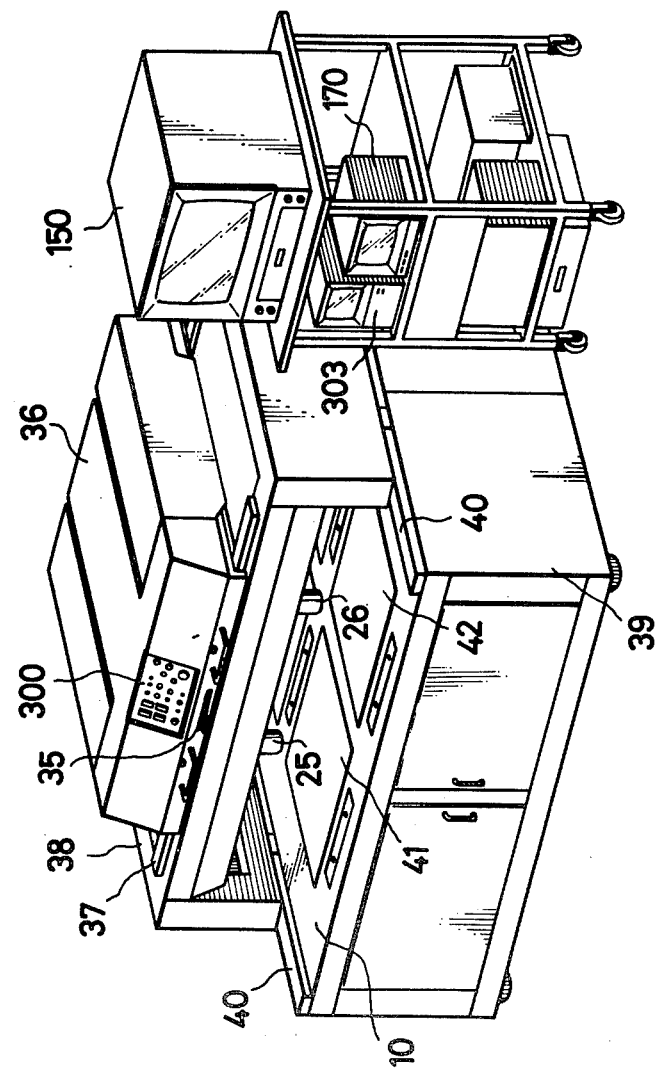
FIG. 4 shows the outer appearance of the apparatus of the present invention.

The lens base 34 is mounted to the camera base 33. The lenses 25 to 28 of high magnification may be switched to the lenses 29 to 32 of low magnification by displacing the lens base 34 relative to the camera base 33 in the transverse direction (left to right as viewed in FIG. 3). The switching of the lenses may be perfomred by operation of a switch lever 35 (FIG. 4). The camera base 33 is mounted on an X-axis drive frame 36 which is slidable on an X-axis rail 37 in the X direction. The X-axis rail 37 is mounted to a Y-axis drive frame 38 which is slidable in the Y direction on a Y-axis rail 40 which (is mounted on the flat setting table 10 and) is oriented perpendicular to the X-axis rail 37. The flat setting table 10 is supported by a frame 39. With this arrangement, the television cameras 21 to 24 are loaded with the lenses of desired magnification and are displaced in both the X and Y directions to take photographs at desired positions.

Referring to FIGS. 3 to 5, light-diffusing plates 41, 42, 43 and 44 of a material such as ground glass or opal glass are fitted in the flat setting table 10 at respective flat support areas. Light sources 45, 46, 47 and 48 are arranged below the light-diffusing plates 41, 42, 43 and 44 to expose the flats 11 to 14 placed on the light-diffusing plates 41 to 44.

Pins bars 49, 50, 51 and 52 are mounted near respective light-diffusing plates 41 to 44. The pin bars are well known as means for setting the flats at to predetermined positions. The distance between pins of the pin bars is selected from the pin bars of various types according to the size of the films to be used. Therefore, the pin bars must be changed according to the film sizes. In the apparatus of the present invention, the registration of each flat may be simultaneously checked, and the positions of the pin bars do not inadvertently change when they are replaced by pin bars of a different size.

As may be seen well from FIGS. 6 and 7, a pin bar setting plate 53 is mounted to the flat setting table 10 by screws 54 and 55 so that the position of the pin bar setting plate 53 may be finely adjustable. Recesses 56 and 57 are formed in the top surface of the pin bar setting plate 53. Projections 59 and 60 are formed on the bottom surface of the pin bar 58 in the positions and sizes corresponding to the recesses 56 and 57. Therefore, the pin bar 58 can be easily positioned by fitting these projections 59 and 60 in the recesses 56 and 57.

A pin bar 58 having a different distance between pins 61 and 62 can be easily positioned.

Another means for positioning the two pins of a desired distance therebetween may be constructed in the manner to be described below. According to this method, all the pins which may be required are embedded at predetermined positions of the flat setting table. The pins which are not used are kept below the surface of the flat setting table, and the pins which are used are exposed through the surface of the flat setting table according to the size of the flat. As shown in FIG. 8, pins 200 are inserted in pin guides 201 which are embedded in the flat setting table 10 and fixed by screws 202 and 203. The lower ends of the pins 200 are coupled to rods 205 which are, in turn, coupled to the pistons in air cylinders 204. The air cylinders 204 are mounted to the flat setting table 10 by frames 206. The pins which are not used do not protrude from the surface of the flat setting table 10 as shown in FIG. 8(b), while the pins which are used protrude from the surface of the flat setting table 10 as shown in FIG. 8(c).

The air cylinders 204 serve to displace the pins 200. After determining which pins are to be used, corresponding air valves 207 are opened to press upward the pistons in these air cylinders so as to protrude the pins 200 over the surface of the flat setting table 10 through the rods 205 which operate in cooperation with these pistons.

In this manner, the required pins may be easily set at the predetermined positions.

Figure 1:
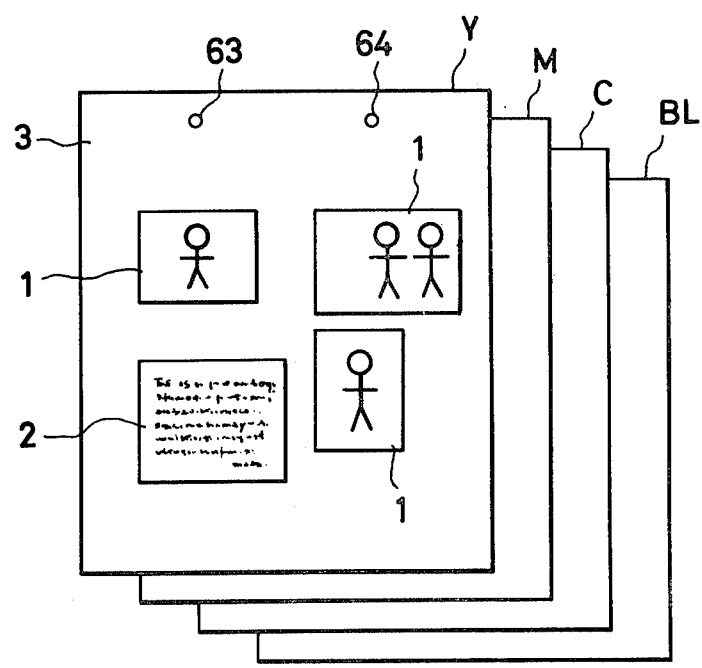
FIG. 1 shows a plurality of flats connected to a transparent base structure.

As may be seen from FIG. 1, holes 63 and 64 are formed in the flat 3 to have a distance corresponding to that between the pins of the pin bar. Therefore, by inserting the pins of the pin bar in these holes 63 and 64, the flat may be set at a predetermined position on the flat setting table 10.

As seen from FIGS. 5 and 9, the flats 11 to 14 for Y, M, C, and BL which are set in the predetermined positions of the flat setting table 10 utilizing the pin bars 49 to 52 are attached to the flat setting table 10 by evacuating air from evacuating holes 66 communicating with the evacuating grooves 65 and an evacuating pipe 67, by means of a vacuum pump (not shown).

The evacuating grooves 65 are formed on the entire surfaces of the light-diffusing plates 41 to 44 in the longitudinal and transverse directions. The pitch of the evacuating grooves 65 is preferably about 3 cm, and the depth and width of the evacuating groove 65 are preferably about 0.5 mm. The diameter of the evacuating pipe is preferably about 3 mm. The evacuating holes 66 are preferably formed at the edges of the flat setting table.

Among evacuating methods for setting the film, a method is most common according to which the evacuating holes are formed at the edges of the table. However, with this method, the air at the central portion of the film is difficult to exhaust, so the evacuating time becomes long. However, by forming the evacuating grooves and the evacuating holes in connection with each other according to the apparatus of the present invention, this problem is eliminated, and the checking time of the film may be shortened.

When the depth of the evacuating groove is too great, it is projected as an image on the CRT monitor. In order to solve this problem, the evacuating grooves preferably have a depth of about 0.5 mm. Since the light emitted from the light sources is irregularly reflected by the light-diffusing plates, the formation of an image of the evacuating grooves on the CRT monitor may be prevented.

After the flats 11 to 14 of four colors, Y, M, C and BL are set on the flat setting table 10, these films are photographed by the television cameras 21 to 24 for each color through lenses of desired magnifications. The light including the image information from the flat, which is enlarged to the desired size through the lens, is converted into electric signals by the photoelectric transducer elements provided in the television cameras 21 to 24. The photoelectric transducer elements may comprise known means such as vidicons, and the television cameras used may be of known types.

The image signals Y, M, C and BL now converted to electric signals are input to an electric signal processor 100 of the electric signal processing section T. At the electric signal processor 100, the black and white level and so forth are controlled by controllers 101, 102, 103 and 104. The image signals are then supplied to a matrix circuit 105. The matrix circuit 105 performs the amplification of the respective signals Y, M, C and BL; the conversion of the signals Y, M, C and BL into three primary color signals of light R (red), G (green) and B (blue); and so on.

The converted signals R, G and B are input to a color CRT monitor 150 of the display section U, and the images of the flats of the respective colors are displayed on the screen of the color CRT monitor.

The controllers 101 to 104 for controlling the levels of the electric signals Y, M, C and BL, and the matrix circuit 105 for converting the signals Y, M, C and BL into the signals R, G and B may comprise known circuits; for example, the system as disclosed in U.S. Pat. No. 3,972,066 may be adopted.

The deflection of the four television cameras 21 to 24, the deflection of a color CRT monitor 150, and the synchronization of the respective circuits are controlled by synchronous pulses $P_1$, $P_2$ and $P_3$ which are generated by a synchronous pulse generator 106.

In this manner, checking of the registration may be instantaneously accomplished by observation of the image formed on the screen of the color CRT monitor which is a composite image of four flats. If the registration of one color deviates, this color is displayed as deviated, so that the checking of the registration is facilitated.

In order to check the screen dots, it is preferable to enlarge the image more than 20 times, However, since a high magnification is involved in this case, the part of the image which may be projected on the color CRT monitor is limited (i.e., only a portion of the flats will appear on the CRT monitor at any given time).

Therefore, when the image is displayed at a high magnification, it is difficult to recognize which part of the flats is displayed. A photographing part indicator to be described below is incorporated in order to facilitate the recognition of the part being displayed with ease. As may be seen from FIGS. 2, 10 and 11, the photographing part indicator comprises a display light source 110, and a mirror 112 for reflecting light 111 emitted from this display light source 110. The angle of the mirror 112 may be controlled by a mirror control support 113. The photographing part indicator is mounted to the lens base 34.

The light 111 emitted from the display light source 110 is reflected by the mirror 112 to reach the flats to be photographed. The position and angle of the mirror is controlled by the mirror control support 113 so that the light 111 reflected by the mirror 112 reaches the part of the flat which is being photographed by the television camera so as to illuminate this part.

With this arrangement, the part illuminated by the light 111 is easily identified as the part which is being photographed by the television camera. The display light source 110 preferably illuminates in a small spot and comprises, for example, a laser-maser.

Although it is possble to constantly illuminate the photographing part in a spot by the light 111, it is also possible to illuminate in a spot the photographing part only in the case of a high magnification by switching on/off the display light source with a switch since the photographing part is hard to recognize only in the case of a high magnification. An example of such an arrangement is shown in FIG. 10. Referring to FIG. 10, a switch 114 is mounted to either the lens base 34 or the camera base 33. When the lens 25 of high magnification is used, the switch is automatically turned on (and the display light source is lit) by the relative displacement of the lens base 34 and the camera base 33. With this arrangement, the operability is improved.

The above description has been made with reference to a laser beam or the like. However, the present invention is not limited to this. For example, the photographing part may be indicated by a pointer or the like.

Although the photographing part indicator may be mounted to each television camera, it is sufficient to mount one photographing part indicator to one of the television cameras only.

The above description has been made with reference to the case wherein the position of the mirror is controlled so that the part illuminated in a spot by the light coincides the part which is being photographed by the television cameras. However, in this case, the light illuminating this part is also photographed by the television cameras. If this must be avoided, the following measure may be taken. Thus, it is possible to mount to the lens a filter which cuts the light illuminating the photographing part and reflected thereby. By controlling the position of the mirror so that the part illuminated in a spot by the light is close to the part photographed by the television cameras, it is possible to know that the part near the spot is the photographing part. The light may alternatively be controlled in a frame shape to surround the part to be photographed by the television cameras. In this manner, it is easy to know which part of the flat is photographed even in the case of high magnification.

Figure 12:
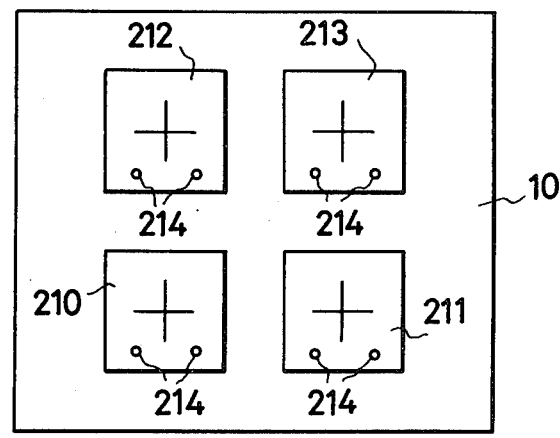
FIG. 12 is a view for explaining the setting conditions of test pattern films on the flat setting table.

As may be seen from the above description, according to the apparatus of the present invention, when the registration of the flats of the respective colors is correct and the flat setting table is set at the correct position, the composite image must be displayed without non-registration between the respective colors. In other words, the relative positions of the images formed by the television cameras must be properly controlled, and control of the relative positions of the images must be confirmed before initiating the previewing operation of the flats. The confirmation of the correct relative positions of the images formed by the respective television cameras may be performed in a manner to be described below. As shown in FIG. 12, test pattern films 210, 211, 212 and 213 which are correctly registered are set at correct positions on the flat setting table 10 as shown in FIG. 12, utilizing register pins 214, for example. These test pattern films 210 to 213 are photographed by the respective television cameras, and the composite image is displayed on the color CRT monitor. The relative positions of the images formed by the respective television cameras may be confirmed by checking if the images of the test patterns are registered. In the case shown in FIG. 12, the test patterns are cross-lines.

Figure 13:
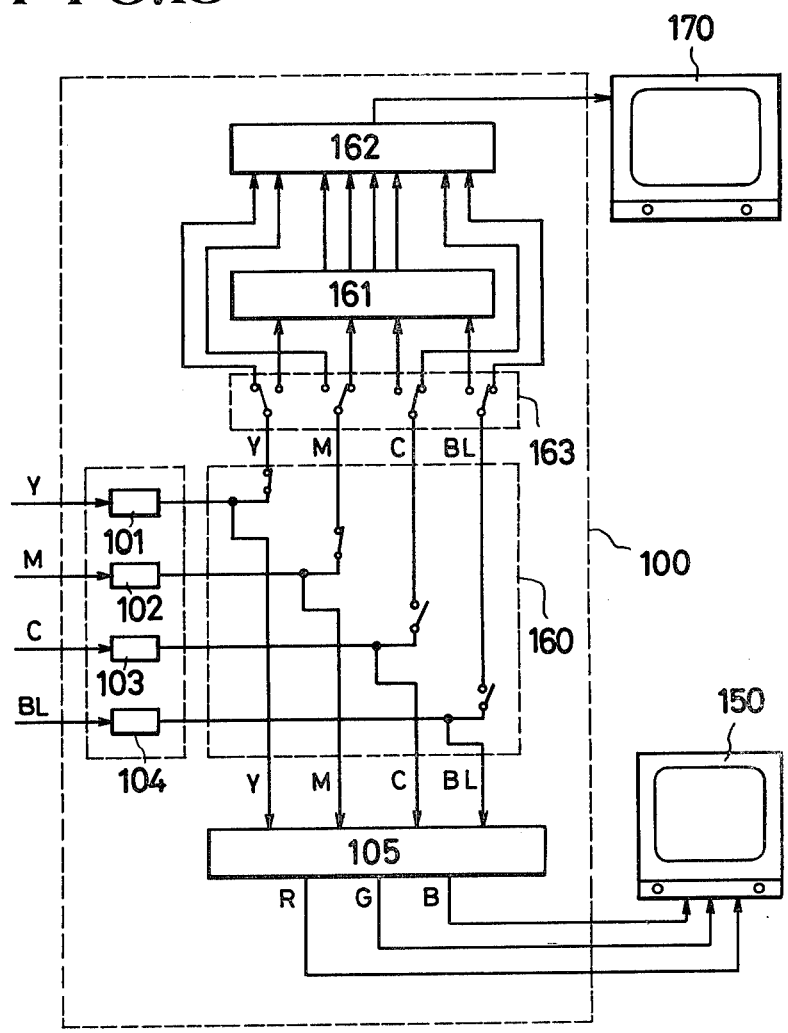
FIG. 13 is a circuit diagram of a circuit which checks the relative positions of the images formed by the television cameras in the apparatus according to the present invention.

FIG. 13 is a partial circuit diagram of the electric signal processor 100 in the apparatus of the present invention, including the circuit for confirming and controlling the relative positions of the images formed by the respective cameras. The synchronous pulse generator 106 is omitted in FIG. 13 for the sake of simplicity. In the case of FIG. 13, the image signals Y, M, C and BL from the respective television cameras are supplied to the controllers 101, 102, 103 and 104 and are divided into two paths; one path leading to the color CRT monitor 150 through the matrix circuit 105 and the other path leading to a black and white CRT monitor 170 through a switch circuit 160. At least two of the image signals Y, M, C and BL which are supplied to the black and white CRT monitor 170 are selected by the switch circuit 160. Between the signals selected in this manner, the signal from the television camera as a reference and one of the selected signals from another television camera are input to a signal inverter 161, and the other of the selected signals is directly supplied to an electric signal mixer 162. The signal inverter 161 and the electric signal mixer 162 are controlled by a switch circuit 163. The signal inverter 161 serves to invert the electric signal; it inverts a positive signal into a negative signal and a negative signal into a positive signal.

Figure 14:
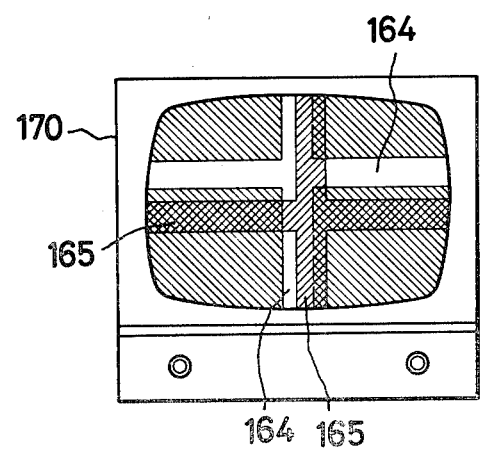
FIG. 14 is a view showing the image displayed on a black and white CRT monitor screen according to image signals obtained from the circuit shown in FIG. 13.

The electric signal supplied to the signal inverter 161 is inverted and is thereafter input to the electric signal mixer 162. The image signal which is supplied to the electric signal mixer 162 through the signal inverter 161 and the image signal which is directly supplied to the electric signal mixer 162 are mixed, amplified and supplied to the black and white CRT monitor 170 to be displayed thereby. Then, by observing the screen, the relative positions of the images may be confirmed. For example, assume that the image signal for the flat for M is supplied to the electric signal mixer 162 through the signal inverter 161 and the image signal for the flat for Y is directly supplied to the electric signal mixer 162 for display at the black and white CRT monitor 170. Then, as shown in FIG. 14, an inverted image 164 of the test pattern for the flat for M and an image 165 of the test pattern of the flat for Y are mixed and displayed. If whitening is detected on the screen, this indicates that the relative positions of the images formed by the two television cameras are not well controlled. Therefore, whether the relative positions of the images formed by the respective television cameras are correct or not may be checked by detection of the whitening on the screen.

The confirmation of whether or not the images of the television cameras are correctly positioned may be accomplished by taking the image of one television camera as a reference and observing the screen of the CRT monitor 170. If the image of the two television cameras deviate from each other, adjustment must be performed to register these images. This may be accomplished in the following manner. As a first alternative, the position of the television camera which is not correctly positioned is moved while keeping the position of the television camera as the reference stationary.

Since better precision may be obtained if the television cameras are stationary, a second alternative is preferably adopted wherein the nonregistering of the images is electrically corrected while maintaining the television cameras stationary. This may be accomplished by changing the scanning position during scanning of the image displayed on the image pickup tube of the television camera. As a third alternative, the positions of pin bars may be moved. The whitening is not observed on the CRT monitor 170 if the relative positions of the images formed by the respective television cameras are correctly controlled. The position of one television camera is thus controlled, and the position of the other television cameras are similarly controlled; the positions of all the television cameras are sequentially controlled.

The precision of checking of the relative positions of the images formed by the respective television cameras may be increased by increasing the magnification.

FIG. 13 shows a case wherein the black and white CRT monitor 170 is used. If a color CRT monitor is used instead, resolution is degraded due to the increase in the dot pitch of the screen, and the confirmation of the position may not be performed with as high a precision.

After correctly controlling the relative positions of the images formed by the respective images (in the above manner), the images displayed on the screen are observed for previewing the registration of the flats. This may be attained by utilizing the color CRT monitor 150.

In the apparatus of the present invention, the registration is checked on the screen of the color CRT monitor. However, color Y is hard to see and color BL tends to cancel other colors. Therefore, these colors are not preferable for checking the registration. In order to solve this problem, it is possible to incorporate separate control knobs for the hue and density. However, as an alternative to or by using together with this method, this problem may be solved in the following manner. That is, when the image formed based on the image signals from the flat of a color which is difficult to see such as Y (yellow) is displayed at a color CRT monitor, the image is displayed in another color which is easy to see, for example, green.

In this case, a switch or the like is incorporated to dislay the flat in either yellow or another color which is easy to see.

Figure 15:
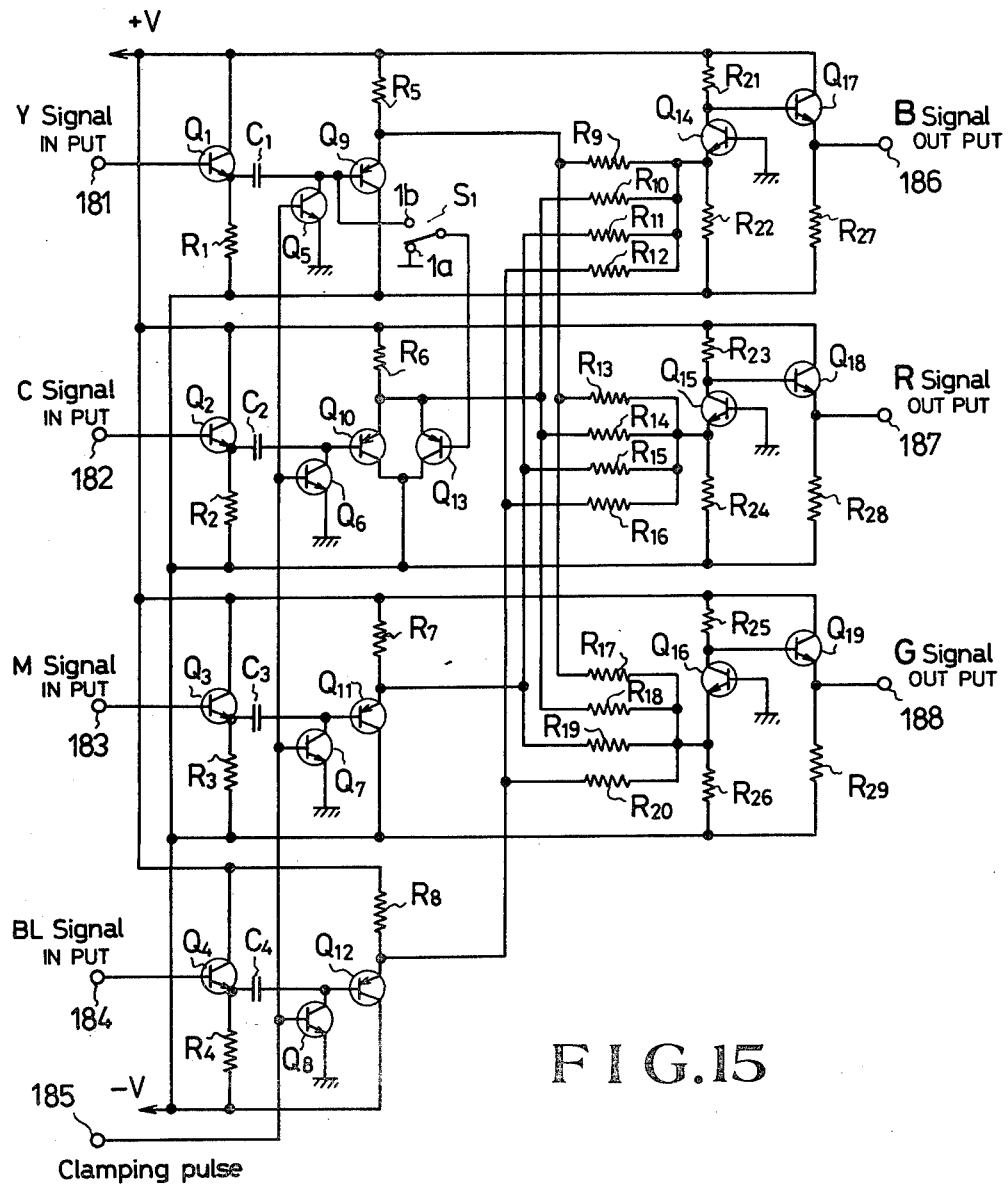
FIG. 15 is a circuit diagram of an exemplified matrix circuit having a function of color conversion in the apparatus according to the present invention.

FIG. 15 is a circuit diagram of the matrix circuit 105 when this matrix circuit 105 has such a function as described above. The image signals Y, C, M and BL representing the image information are supplied to respective terminals 181, 182, 183 and 184. The image signal Y from the television camera for the flat for Y is supplied to a transistor Q1 through the terminal 181 and is applied to a DC current regeneration circuit which consists of a clamping capacitor C1 and a transistor Q5. In response to a clamping pulse supplied to a terminal 185 in synchronism with the flyback time of the image signal, the current regeneration circuit turns on the transistor Q5 to regenerate the DC current components.

The image signal with the regenerated DC current components is supplied to matrix resistors R9, R13 and R17 through transistor Q9 to be converted into primary color signals B (blue), R (red) and G (green). The electric signal B is supplied to a CRT monitor, such as a color CRT monitor through transistors Q14 and Q17 and a terminal 186. The electric signal R is supplied to the color CRT monitor through transistors Q15 and Q18 and a terminal 187. The electric signal G is supplied to the color CRT monitor through transistors Q16 and Q19 and a terminal 188.

Figure 16:
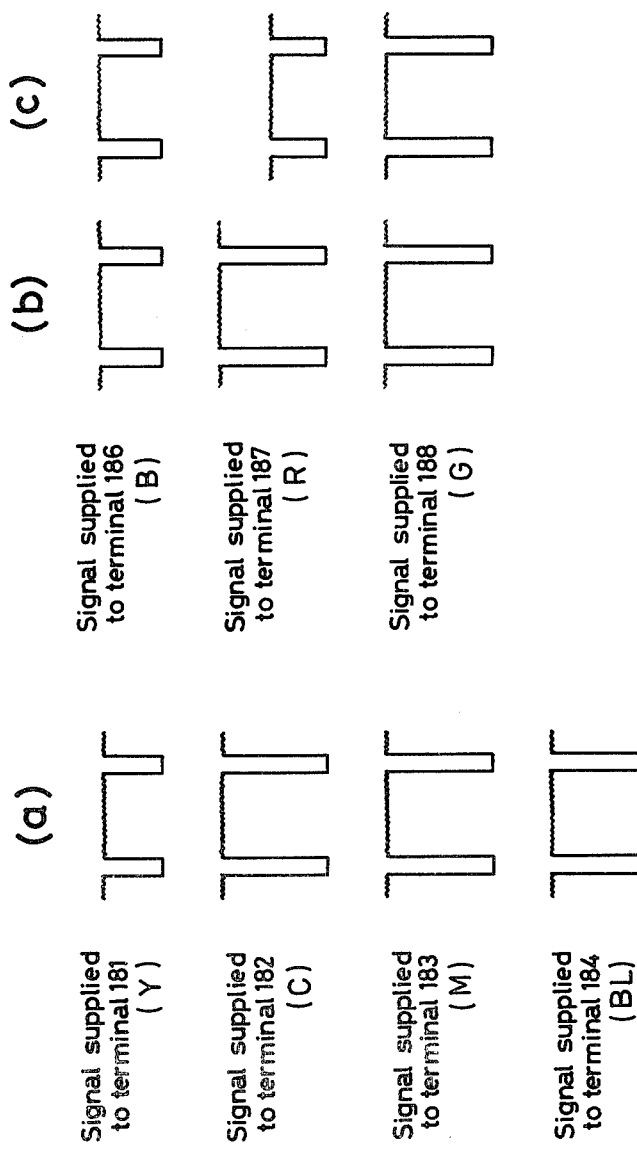
FIGS. 16(a) to 16(c) show the waveforms of input and output signals of the circuit shown in FIG. 15.
Figure 18:
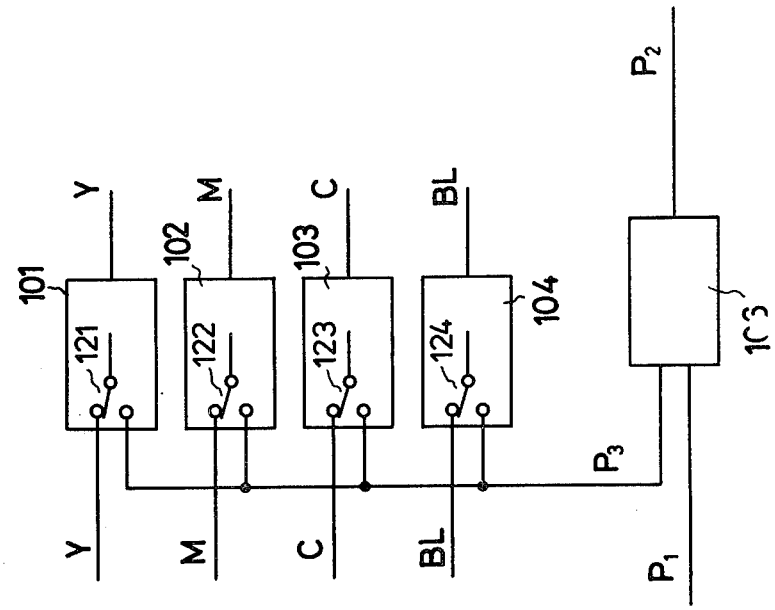
FIG. 18 is a block diagram of a switching mechanism of a spurious signal from a spurious signal generator and the image signal from the television camera in the apparatus according to the present invention.

The image signals C, M and BL supplied to the terminals 182, 183 and 184 are processed in the same manner as the electric signal of the flat for Y and are converted into the electric signals B, R and G by matrix resistors R10, R11 and R12; R14, R15 and R16; and R18, R19 and R20, respectively. The main components of the electric signal B are the image signals corresponding to the flat for Y. The main components of the electric signal R are the image signals of the flat for C. The main components of the electric signal G are the image signals of the flat for M. Among the colors which are reproduced on the screen of the color CRT monitor in this manner, the density yellow is hard to check in comparison with the other colors. Therefore, in the case of checking the registration, it is better to reproduce yellow in a color which is easy to distinguish on the CRT monitor screen. When this measure is taken, it is easy to check the registration of yellow. If only the flat for Y has a density among the respective flats for Y, M and C and BL, the image signal Y supplied to the terminal 181 alone will be of low level as shown in FIG. 16(a) among the image signals supplied to the terminals 181 to 184 of the matrix circuit.

When a switch S1 in a base circuit of the transistor Q13 is switched to the side of a contact 1a, the transistor Q13 is rendered nonconductive. Therefore, the levels of the electric signals R and G are substantially the same as shown in FIG. 16(b), and the level of the electric signal B alone is low, so that yellow is reproduced on the color CRT monitor. On the other hand, when the switch S1 is switched to the side of a contact 1b, the level of a signal supplied to the base of the transistor Q13 becomes the same as the level of a signal supplied to the base of the transistor Q9. The signal supplied to either of the transistor Q10 or Q13, the base potential of which is the lower of the two, is output to the emitters of the transistors Q10 and Q13. Therefore, when the image signals as shown in FIG. 16(a) are applied to the terminals 181 to 184, a signal of low level is supplied to the terminal 181, that is, the same signal supplied to the emitter of the transistor Q9, is supplied to the emitters of the transistors Q10 and Q13. Therefore, the electric signals B and R supplied to the terminals 186 and 187 are of low level, and the electric signal G supplied to the terminal 188 is of high level as shown in FIG. 16(c), so that the image is reproduced in green. The above description has been made with reference to a circuit for converting yellow to green. However, yellow may be displayed in any other color including gray in a similar manner. For example, by disconnecting the emitter of the transistor Q13 from the emitter of the transistor Q10 and connecting it with the emitter of the transistor Q11, yellow may be reproduced in red on the screen of the color CRT monitor.

In this manner, according to the previewing apparatus of the present invention which has a function to convert one color to another, a color which is hard to recognize may be converted into a color which is easy to recognize to simplify the previewing of the flats.

According to the previewing apparatus of the present invention, the tone may be checked as well as the registration. When such registration or tone is to be checked, there are cases where it is preferred to display the image on the screen of the color CRT monitor with particular color components being eliminated. In such a case, it is of course possible to replace the flat of the color which is to be eliminated with a film having a density equal to the base density of this flat, to photograph this film with a television camera, and to display the image on the screen of the color CRT monitor. However, this results in degradation of working efficiency. Therefore, with the previwing apparatus of the present invention, it is possible to display the image with the particular color components being eliminated without involving such elaborate replacement of the films. This may be accomplished in the manner to be described below.

FIGS. 17(a) to 17(d) show the levels of the image signals corresponding to the respective television cameras, the levels of the image signals being inversely proportional to the densities of the flats.

Figure 17:
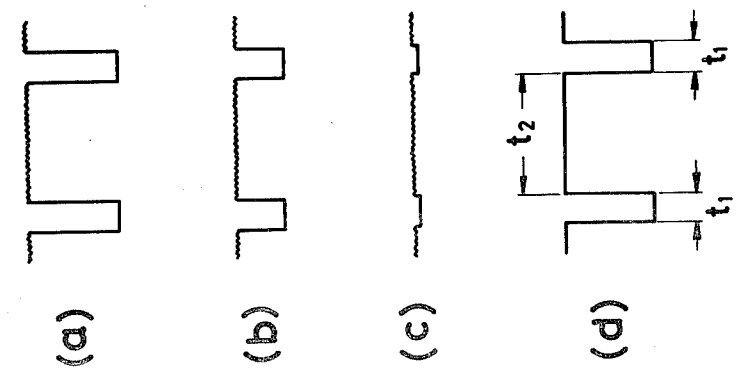
FIGS. 17(a) to 17(d) show the waveforms of the image signals and blanking signals at respective densities of the flats.

FIG. 17(a) shows the output waveform of the image signal when the dot density of the flat is 0%. The signal level becomes maximum in this case. FIG. 17(b) shows the output waveform of the image signal when the dot density of the flat is 50%. The signal level in this case becomes half that shown in FIG. 17(a). FIG. 17(c) shows the output waveform of the image signal when the dot density of the flat is 100%. In this case, the signal level is substantially zero. Therefore, in order to eliminate the color components of a particular flat from the image formed on the screen of the color CRT monitor, a film of 0% dot density is photographed by the television camera corresponding to the color to be eliminated, and the image signal as shown in FIG. 17(a) is applied to the controllers 101 to 104. However, if the flat must be replaced to be photographed each time this operation is done, workability is significantly degraded. Therefore, according to the apparatus of the present invention, a bogus image signal corresponding to the image signal as shown in FIG. 17(a) is electrically generated. This bogus image signal and the image signal from the television camera can be selectively supplied to the color CRT monitor by means of a switch. With this arrangement, it is possible to instantaneously eliminate or add a particular color.

Although the image signals output from the respective television cameras have blanking periods t1 and imaging periods t2 as shown in FIGS. 17(a) to 17(d), the four television cameras are synchronized by the synchronous pulse $P_1$ generated from the synchronous pulse generator 106, so that the in-phase image signals are output from the respective television cameras. The blanking signal as shown in FIG. 17(d) which is also generated by the synchronous pulse generator 106 is also in-phase with the image signals. Therefore, the level of the blanking signal generated by the synchronous pulse generator 106 is adjusted to be the same as that of the image signal when the dot density of the flat is zero. The signal obtained is supplied to one of the controllers 101 to 104 as the spurious image signal $P_3$.

This spurious image signal and the image signals from the respective television cameras are switched by input signal switches 121, 122, 123 and 124 so as to instantaneously eliminate or add color components of a particular flat. In other words, the synchronous pulse generator 106 includes a spurious image signal generator. It is to be noted that the switching noise is included in the image on the screen of the color CRT monitor if the input signal switches 121 to 124 are switched at random. In order to eliminate this, it is preferable to switch the input signal switches 121 to 124 at the timing of the leading edge of the vertical blanking signal, so that the switching noise may be eliminated within the vertical blanking period.

According to the previewing apparatus of the present invention, it is possible to display the image with a particular color being eliminated. Furthermore, it is not necessary to replace the flat of the corresponding color with a film having a density equal to the base density.

Various functions of the previewing apparatus of the present invention have been described. FIG. 19 is a schematic block diagram of the entire circuitry including the previewing apparatus of the present invention. An operation panel 300 shown in FIG. 19 is incorporated for selection of the negative or positive display of the flat; selection of white display by the spurious image signal; and adjustments of gradation such as correction of the middle tone, gradation correction of the high lights and the shadow point, and adjustments of white level (gain) and black level (pedestal). This operation panel 300 is useful not only for checking the registration but also for checking the tone of the flats. The circuit of the operation panel 300 may be the one as shown in U.S. Pat. No. 3,972,066 as described above, so the details thereof will not be described.

A registration control panel 301 is used so that the images corresponding to the respective television cameras may coincide with each other. A source of suction 302 serves to evacuate the flat setting table. The waveforms of the electric signals may be viewed by an oscilloscope 303. The signal to be input to the oscilloscope 303 is selected by an oscilloscope selector 304. The image signals from the four television cameras are selectively supplied to a black and white CRT monitor through a selector 305.

The light for radiating the flats is emitted from a light source 306.

According to the previewing apparatus of the present invention, various items of the flats may be checked. Especially in the case of the checking of registration, it becomes necessary to display the image on the screen of the color CRT monitor at a magnification of more than 20 times. When a lens of high magnification is used, the distance between the lens and the image pickup tube of the television camera becomes great. On the other hand, when a lens of short focal length is used, the distance between the lens and the image pickup tube of the television camera becomes smaller. However, the operation during the setting of the flats or the like becomes degraded. Therefore, a lens of excessively short focal length is not preferable. When the distance between the lens and the image pickup tube becomes great, irregular reflection inside the lens barrel (flare) becomes predominant and resolution becomes extremely degraded.

Figure 20A:
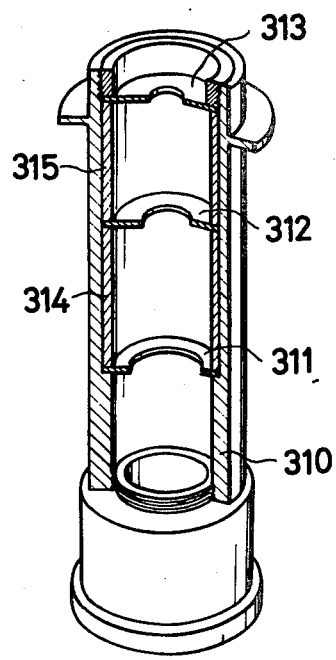
FIGS. 20(a) and 20(b) are views showing a lens of high magnification with a flare-prevention ring which is used in the apparatus according to the present invention.

In order to eliminate such adverse effects of flare, flare-preventive rings 311, 312, and 313 are mounted inside a lens barrel 310 of the lens shown in FIG. 20(a). These flare-preventive rings 311, 312 and 313 are fixed by ring fixing cylinders 314 and 315 shown in FIG. 20(*b*). The central parts of the flare-preventive rings provide light-transmitting parts, and the peripheries thereof provide light-shielding parts.

Figure 20B:
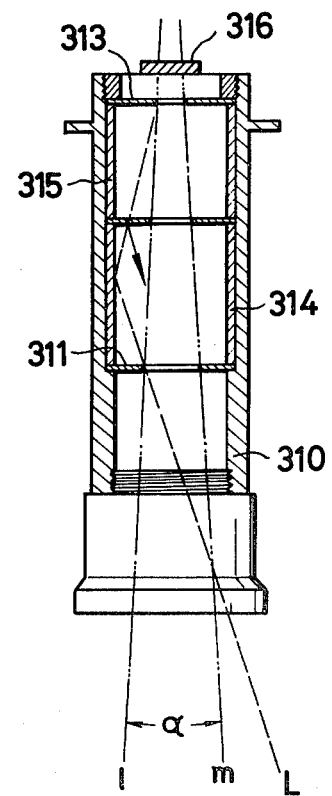

The size of the openings of the rings is set to be equal or less than the parts of the rings defined by lines 1 and m connecting the photographing effective size of the lens and the effective size of an image pickup tube 316 of the television camera as shown in FIG. 20(*b*). When the flare-preventive rings have such sizes, the light incident within an effective angle α becomes directly incident on the image pickup tube 316 while the other portion of the light is shielded by the flare-preventive rings and does not reach the image pickup tube.

When the lenses with the flare-preventive rings are used, adverse effects of the flare may be eliminated to the minimum, degradation of resolution may be prevented, and precision of previewing may be improved.

Although the present invention has been described with reference to the preferred embodiments, it is to be understood that various other changes and modifications may be made.

For example, the description has been made with reference to transmitted light. However, transmitted light need not always be used; reflected light may be used. In order to utilize reflected light, the surface of the flat setting table must be made white or the like, and the position of the light source must be changed to that for a light source for reflected light.

In the embodiments described above, the television cameras are moved. However, the television cameras may be kept stationary, and the flat setting table may be moved. Alternatively, both may be movable.

In place of a combination of the vacuum grooves and vacuum holes as a means for attaching the flats onto the flat setting table, a number of evacuating holes may be used. Alternatively, it is also possible to cover the flat with a transparent film or a transparent glass sheet.

It is also possible to use an image of the continuous-tone separation film or an image of screened separation film as an image of flats. Since the technology related to this is well known, it will not be described herein.

According to the apparatus of the present invention, the checking of the registration is simplified and may be performed quickly. The efficiency and precision of the previewing of the flats may be improved. Since the checking precision of the registration is improved, the efficiency of printing of a proof is improved. Furthermore, since reprinting after proof due to unsatisfactory registration may be reduced to the minimum, the cost of the printing material may be reduced to the minimum.

Since the efficiency of the printing of a proof is improved and defective registration during printing is reduced to the minimum, printing efficiency is also improved.

Conventionally, registration is checked by a retoucher. Therefore, unsatisfactory registration is frequently caused in the printing of a proof and actual printing. However, according to the apparatus of the present invention, previewing of the registration becomes possible at less cost and quickly, and troubles originating from unsatisfactory registration are significantly reduced. The apparatus of the present invention can be effectively utilized for checking the color obtained by overlapping the screen tint and double printing of the characters.

Furthermore, with the apparatus of the present invention, various items may be checked easily and efficiently such as checking of the presence or absence of characters or figures, checking of separation quality, copy, dummy, screen tint and other instructions for completeness and accuracy.

According to the apparatus of the present invention, in addition to the advantages as described above, the tone of the printed material may be estimated from the flats as in the case of conventional apparatuses, so that the previewing efficiency of the flats may be significantly improved.

What is claimed is:

1. A previewing apparatus, comprising:
a flat setting table having a plurality of spaced flat support areas each being capable of supporting a respective color separation flat;
a plurality of television cameras, each said camera being associated with a respective said flat support area and having a magnifying lens which permits said camera to view only a portion of its associated flat support area at any given instant;
a support structure for maintaining said cameras in fixed positions relative to one another and for permitting relative movement between said cameras as a unit and said flat setting table whereby the particular portion of each flat support area which is viewed by its associated said camera may be changed by causing relative movement between said cameras as a unit and said flat setting table; and
an electric signal processor which so processes electric signals generated by said cameras that when said processed signals are applied to a color monitor, said color monitor displays the superimposed images of the flats which are located at said flat support areas.

2. An apparatus according to claim 1, characterized in that evacuating grooves and evacuating holes associating respective color separation to be used in color printing).

3. An apparatus according to claim 1, further comprising a photographing part indicator for indicating which portion of each said flat support area is being viewed at any given instant by its respective said camera.

4. An apparatus according to claim 1, wherein each of said cameras is adapted to view a flat which corresponds to a respective color and wherein said electric signal processor includes a circuit to display the image obtained from at least one of said flats in a different color from its respective color.

5. An apparatus according to claim 1, characterized in that a bogus image signal generator is mounted to said electric signal processor so that a bogus image signal from said bogus signal generator and image signal from said television cameras can be switched.

6. An apparatus according to claim 1, characterized in that said electric signal processor includes a signal inverting circuit which inverts the electric signal from at least one of said plurality of television cameras, an electric signal mixer which mixes the inverted electric signal obtained from said signal inverting circuit and the electric signal from any one of said television cameras which is input without intermediary of said signal inverting circuit, a switching circuit which supplies the electric signals from at least two of said plurality of television cameras to said electric signal mixer, and a black and white CRT monitor which displays an image based on the mixed electric signal obtained from said electric signal mixer.

7. An apparatus according to claim 1, wherein each said flat support areas is associated with a respective pin bar setting plate with a pin bar fixing recess which is mounted on said flat setting table so that a position of said pin bar setting plate can be adjusted, and a pin bar with a projection on a rear surface of the pin bar to fit in said recess of said pin bar setting plate is detachably mounted to said pin bar setting plate.

8. An apparatus according to claim 1, wherein each said lens includes a flare-preventive ring.

9. An apparatus according to claim 1, wherein said flat support areas all lie in a common plane and wherein said support structure permits said cameras to be moved as a unit along a plane which is parallel to said common plane.

10. A previewing apparatus for flats, characterized in that it comprises a flat setting table for holding a plurality of flats, a plurality of television cameras for photographing images of said flats, an electric signal processor which processes electric signals from said plurality of television cameras to display the images on a color CRT monitor corresponding to colors of said plurality of flats, and a color CRT monitor which displays the images of said flats based on the electric signals processed by said electric signal processor, said plurality of television cameras being held to maintain relative positions therebetween, and said flat setting table and said plurality of television cameras being movable relative to one another, a first plurality of lenses of equal magnification, said first plurality being equal in number to the number of said television cameras, said first plurality of lenses being fixedly mounted to a lens base in correspondence with an arrangement of said plurality of television cameras, and a second plurality of lenses of another magnification, said second plurality of lenses being equal in number to the number of said first plurality of lenses, said second plurality of lenses being similarly fixedly mounted to said lens base so that the magnification may be switched by moving said lens base relative to said television cameras.

11. A previewing apparatus for flats, characterized in that it comprises a flat setting table for holding a plurality of flats, a plurality of television cameras for photographing images of said flats, an electric signal processor which processes electric signals from said plurality of televison cameras to display the images on a color CRT monitor corresponding to colors of said plurality of flats, and a color CRT monitor which displays the images of said flats based on the electric signals processed by said electric signal processor, said plurality of television cameras being maintained in fixed positions relative to one another, said cameras as a unit and said flat setting table being movable relative to one another, and a bogus image signal generator mounted to said electric signal processor so that a bogus image signal from said bogus image signal generator and an image signal from said television cameras can be switched.

12. A previewing apparatus for flats, characterized in that it comprises a flat setting table for holding a plurality of flats, a plurality of television cameras for photographing images of said flats, an electric signal processor which processes electric signals from said plurality of television cameras to display the images on a color CRT monitor corresponding to colors of said plurality of flats, and a color CRT monitor which displays the images of said flats based on the electric signals processed by said electric signal processor, said plurality of television cameras being held in fixed positions relative to one another, said cameras as a unit and said flat setting table being movable relative to one another, said electric signal processor including a signal inverting circuit which inverts the electric signal from at least one of said plurality of television cameras, and an electric signal mixer which mixes the inverted electric signal obtained from said signal inverting circuit and the electric signal from any one of said television cameras which is input without intermediary of said signal inverting circuit, a switching circuit which supplies the electric signals from at least two of said plurality of television cameras to said electric signal mixer and a black and white CRT monitor which displays an image based on the mixed electric signals obtained from said electric signal mixer.

* * * * *